(12) United States Patent
Asano et al.

(10) Patent No.: US 6,316,827 B1
(45) Date of Patent: Nov. 13, 2001

(54) SEMICONDUCTOR DEVICE HAVING IMPROVED TEMPERATURE DISTRIBUTION

(75) Inventors: Kazunori Asano; Kouji Ishikura, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/151,276

(22) Filed: Sep. 11, 1998

(30) Foreign Application Priority Data

Sep. 12, 1997 (JP) .................................................. 9-267750

(51) Int. Cl.[7] ............................ H01L 29/41; H01L 29/80; H01L 21/58
(52) U.S. Cl. .......................... 257/706; 257/276; 257/341; 257/275; 257/277; 257/287; 257/712; 257/469; 257/579; 257/583; 257/563; 257/280
(58) Field of Search ..................................... 257/706, 276, 257/275, 712, 713, 341, 287, 277, 469, 579, 583, 563, 280

(56) References Cited

U.S. PATENT DOCUMENTS

| | | | |
|---|---|---|---|
| 4,659,421 | * | 4/1987 | Jewett ..................................... 156/605 |
| 5,034,792 | * | 7/1991 | Kimura et al. . |
| 5,283,452 | * | 2/1994 | Shih et al. ............................. 257/277 |
| 5,334,871 | * | 8/1994 | Andoh ................................... 257/275 |
| 5,517,224 | * | 5/1996 | Kaizu et al. ........................... 347/59 |
| 5,614,762 | * | 3/1997 | Kanamori et al. ..................... 257/276 |
| 5,633,517 | * | 5/1997 | Saitoh .................................... 257/277 |
| 5,635,736 | * | 6/1997 | Funaki et al. .......................... 257/202 |
| 5,742,498 | * | 4/1998 | Taniguchi et al. ..................... 363/145 |
| 5,743,956 | * | 4/1998 | Habuka et al. ......................... 117/89 |
| 5,763,856 | * | 6/1998 | Ohkase ................................... 219/390 |
| 5,818,077 | * | 10/1998 | Takahashi et al. ..................... 257/276 |
| 5,831,248 | * | 11/1998 | Hojyo et al. ........................... 219/388 |
| 5,850,099 | * | 12/1998 | Liu ......................................... 257/287 |
| 5,883,407 | * | 3/1999 | Kunii et al. ............................ 257/275 |
| 5,920,087 | * | 7/1999 | Nakagawa et al. ..................... 257/140 |
| 5,925,901 | * | 7/1999 | Tsutsui ................................... 257/276 |
| 5,939,753 | * | 8/1999 | Ma et al. ............................... 257/339 |
| 5,976,989 | * | 11/1999 | Ishiguro ................................. 438/758 |
| 5,986,338 | * | 11/1999 | Nakajima ............................... 257/700 |

(List continued on next page.)

FOREIGN PATENT DOCUMENTS

| | | |
|---|---|---|
| 56-131936 | 10/1981 | (JP) . |
| 61-23350 | 1/1986 | (JP) . |
| S63-124568 | 5/1988 | (JP) . |
| H06-310545 | 11/1994 | (JP) . |
| H08-195402 | 7/1996 | (JP) . |
| H09-223703 | 8/1997 | (JP) . |

Primary Examiner—Alexander O. Williams
(74) Attorney, Agent, or Firm—Sughrue, Mion, Zinn, Macpeak & Seas, PLLC

(57) ABSTRACT

A semiconductor device of the present invention includes ohmic source plate electrodes, gate plate electrodes, and drain plate electrodes in parallel from each other in a heat generating region various designs are used to more evenly distribute heat generated in the semiconductor device. A first example has gold-plate electrodes formed on the respective source and drain plate electrodes in parallel with the ohmic plate electrodes. The gold-plate electrode arranged at the central portion of the heat generating region plate electrodes has the widest width and gold-plate electrodes arranged toward the center portion to the peripheral portion of the heat generating region narrow gradually. By the structure mentioned above, the semiconductor device of the present invention has uniform temperature distribution in a heat generating region. A second example uses a plurality of stripe plates perpendicular to the ohmic plate electrodes. Those stripe plates are of varying separation distances, being closer at the center of the heat generating region. A third example varies the thickness of the semiconductor substrate inversely proportional to the distance from the center of the heat generating region.

15 Claims, 13 Drawing Sheets

U.S. PATENT DOCUMENTS 6,002,109 * 12/1999 Johnsgard et al. .................... 219/390
6,002,183 * 12/1999 Iversen et al. ....................... 307/147
6,016,383 * 1/2000 Gronet et al. ....................... 392/416
6,020,613 * 2/2000 Udomoto et al. .................... 257/341
6,037,241 * 3/2000 Powell et al. ....................... 438/479

* cited by examiner

LENGTH OF HEAT GENERATING REGION IN THE DIRECTION OF FINGERS ($\mu$m)

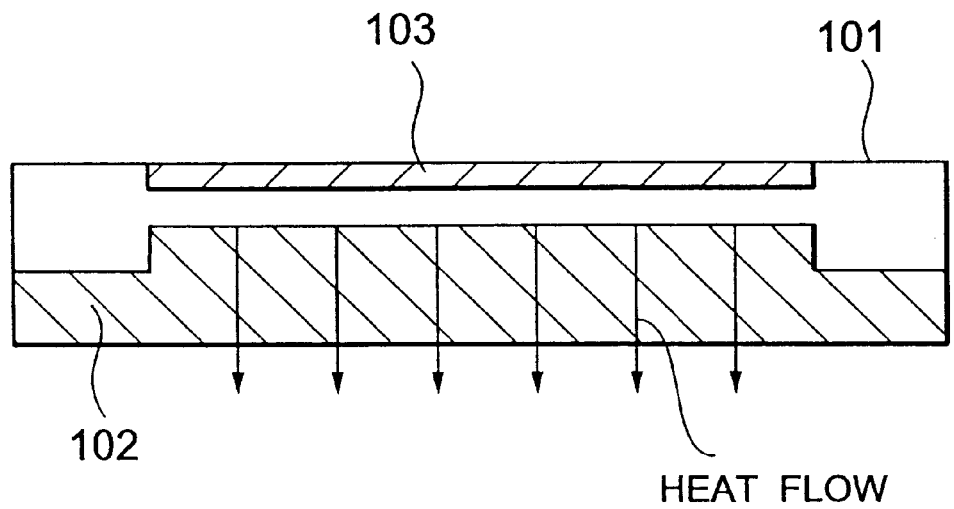
Fig. 14 [prior art]
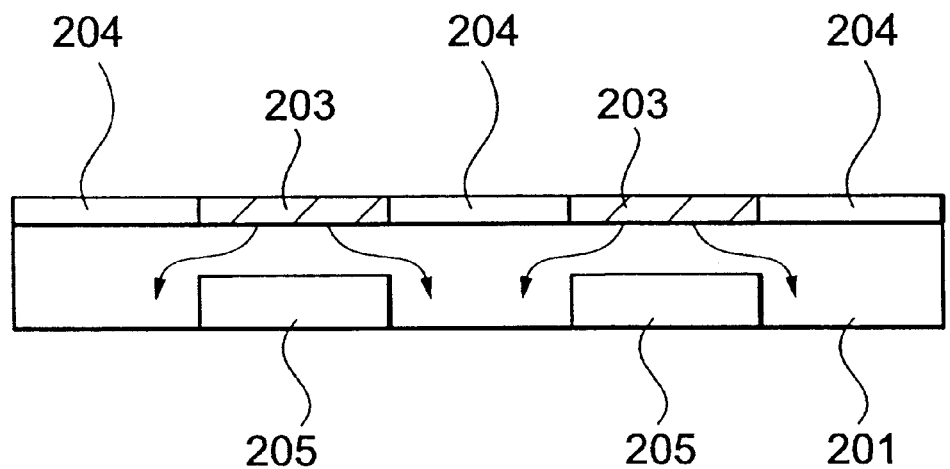
Fig. 15 [prior art]

US 6,316,827 B1

SEMICONDUCTOR DEVICE HAVING IMPROVED TEMPERATURE DISTRIBUTION

BACKGROUND OF THE INVENTION

1. Field of the Invention

The present invention relates to a semiconductor device, and more particularly to reliability of a semiconductor transistor against heat.

2. The Related Art

Semiconductor transistors are used as amplifiers for mobile communication and satellite communication. Demands for higher power are increasing with regard to these semiconductor transistors. However, higher power is accompanied by increased heat generation, which can adversely influence the life of the semiconductor transistor. Some of the adverse influences that result from an increase in heat generation affect the characteristics of the semiconductor transistor and result in, for example, decreased drain current and increased gate leakage current. These not only can cause degradation in the characteristics at high temperature, but sometimes cause irreversible degradation. As a result, the device characteristics do not return to normal after the temperature falls, and may even result in massive failure or breakage. Accordingly, in making such a high power semiconductor transistor device, a technique is needed to maintain its characteristics against heat degradation.

One means for preventing transistor heat degradation is introduced in Japanese Patent Application Laid-open No. Sho 61-23350. FIG. 14 shows a sectional view of a semiconductor device (an FET substrate) described in the application No. Sho 61-23350. A cavity is provided in the rear surface of a semiconductor substrate 101. Heat generating region (active region or element formation region) 103 is formed on the front surface of the semiconductor substrate 101 and gold-plate electrode for heat radiation 102 is formed on the back surface of the semiconductor substrate 101. By making the thickness of the substrate right below the heat generating region 103, the heat radiation of the region small (thin) is enhanced.

Japanese Patent Application Laid-open No. Sho 56-131936 also proposes such a semiconductor device. FIG. 15 shows a sectional view of a semiconductor integrated circuit device described in the Application No. Sho 56-131936. A plurality of heat generating region 203 are formed on a front surface of a semiconductor substrate 201. The heat generating regions 203 are surrounded by non-generating heat regions 204. Gaps 205 are formed on a back surface of the semiconductor substrate 201 so as to oppose the respective heat generating regions 203.

However, the inventor has determined that a heat generating region of the semiconductor device has a temperature distribution depending on its shape. That is, temperature produced at a central portion of the heat generating region is high compared with temperature produced at a peripheral portion of the heat generating region. Thus, the conventional devices have the problem that device characteristics deterioration occurs at the center portion of the heat generating regions (localized hot spots) of the device due to uneven distribution in the heat generating region and concentration of the heat at the center of the heat generating portion of the device.

SUMMARY OF THE INVENTION

One object of the present invention is to provide a semiconductor device which has uniform temperature distribution throughout a heat generating region of a semiconductor device so as to reduce or eliminate localized hot spots.

A semiconductor device according to the present invention is characterized that the shape of plate electrodes, which are formed over source plate electrode or drain plate electrodes of a transistor, or the shape of the rear surface substrate in a heat generating region is formed differently with regard to the center portion and a peripheral portion of the heat generating region.

More specifically, a plate electrode located around the center portion of the heat generating region has a width larger than the width of a plate electrode located around a peripheral portion of the heat generating region.

Further, the plate electrodes are formed so as to be perpendicular to at least one of the drain and source plate electrodes, and the density of the plate electrodes is dense around the center portion of the heat generating region and is sparse at a peripheral portion of the heat generating region.

Still further, the thickness of a substrate at the rear surface of the heat generating portion is thin at the center portion of the heat generating region, and is thick at a peripheral portion of the heat generating region.

Paths of dissipation of generated heat are dissipation from an upper portion of a heat generating region into the air and dissipation from the rear surface of a heat generating region to a seating. By processing plate electrodes or the rear surface substrate in a heat generating region, the heat radiation of the center portion of the heat generating region is enhanced compared with that of a peripheral portion of the heat generating region. Thus, the temperature distribution of heat in the generating region is substantially even and localized hot spots are reduced or eliminated. Accordingly, heat at the center portion of the heat generating region is suppressed and temperature of the respective portions of the heat generating region approaches the average temperature of the entire region, which reduces the adverse effects of heat on the characteristics of the semiconductor transistor.

BRIEF DESCRIPTION OF THE DRAWINGS

The above and other objects, advantages and features of the present invention will be apparent from the following description taken in conjunction with the accompanying drawings, in which:

FIG. 8A shows a top view of a semiconductor transistor, FIG. 8B shows a partial sectional view taken along the line 8C–8C' of FIG. 8A.

FIG. 11A illustrates a plan view, FIG. 11B illustrates a sectional view taken along the line 11D–11D' of FIG. 11A, FIG. 11C illustrates a sectional view taken along the line 11E–11E' of FIG. 11A.

FIG. 14 illustrates a sectional view of a first conventional semiconductor device.

FIG. 15 illustrates a sectional view of a second conventional semiconductor device.

DETAILED DESCRIPTION OF THE PREFERRED EMBODIMENTS

Figure 1:
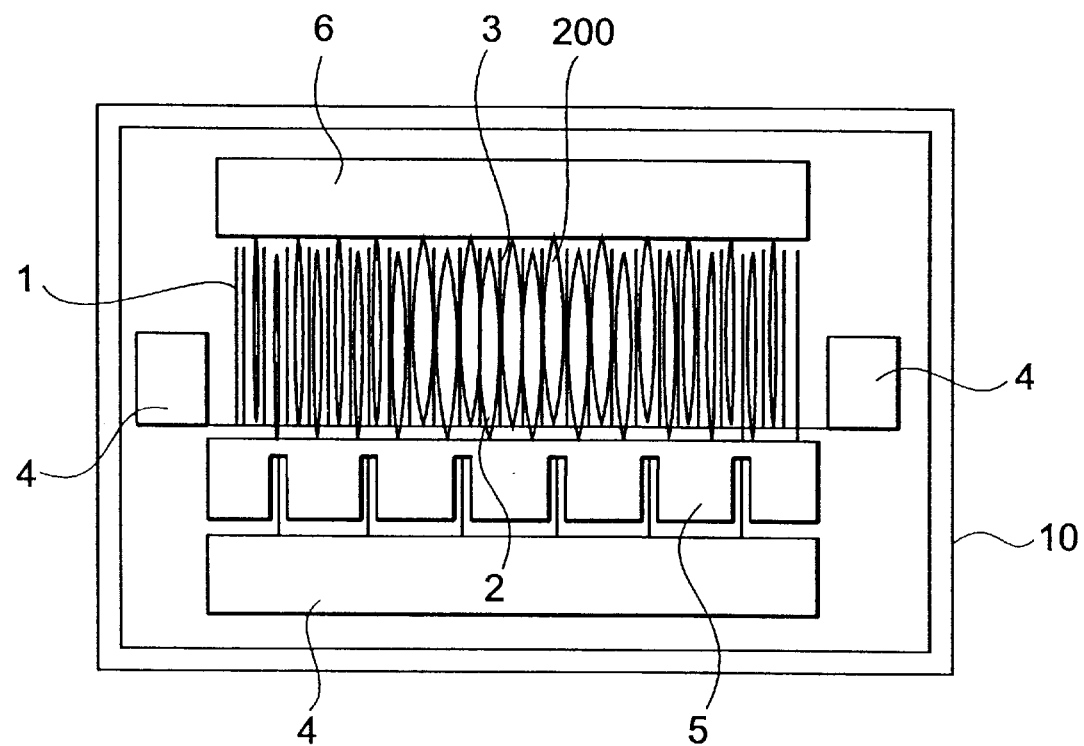
FIG. 1 illustrates a top view of a semiconductor device of a first embodiment of the present invention.
Figure 2:
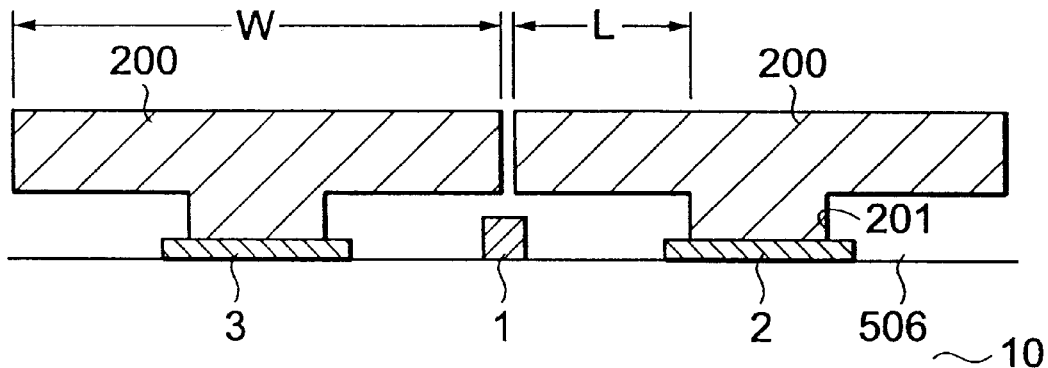
FIG. 2 illustrates a sectional view of a transistor of the semiconductor device shown in FIG. 1.

FIGS. 1 to 7 show a first embodiment of the present invention. Referring to FIGS. 1 and 2, on a semiconductor substrate 10, a plurality of drain plate electrodes (drain fingers) 3 which are ohmic plate electrodes and source plate electrodes (source fingers) 2 which are ohmic plate electrodes, are formed in parallel and are interdigitated with one another. A plurality of gate plate electrodes (gate fingers) 1 are formed between the respective drain plate electrode 3 and the respective source plate electrode 2 in parallel with those drain and source electrodes. The drain plate electrodes 3 are connected to a drain plate electrode pad 6. The source plate electrodes are connected to a source plate electrode pad 5. The gate plate electrodes are connected to gate plate electrode pads 4.

On the ohmic plate electrodes, as source plate 2 and drain plate electrodes 3, gold-plate electrode 200 are formed in a T-shape (see FIG. 2). The gold-plate electrode 200 has wings (extending portion) of width L to adjust the amount of heat radiation, adjusting by the width L of the gold-plate electrode 200. The width of the ohmic plate electrodes is, for example, 8 μm, and the distance between the ohmic plate electrodes is, for example, 9 μm.

Regarding one gold-plate electrode 200, the gold-plate electrode has the width which is larger at the center portion than with the other potion thereof. As illustrated in FIG. 1, the width of the gold-plate electrode 200 is tapered so as to be gradually smaller from at the center portion to the ends of the gold-plate electrode 200. Further, the wing width L and total width W of the respective gold plate electrodes 200 varies depending on their proximity to the center portion of the heat generating region. Thus, of a plurality of the gold-plate electrodes 200, the gold-plate electrode 200 arranged at the central portion in heat-generating region has the widest width. In general, the width of the gold-plate electrodes 200 is narrower gradually from the central portion to the peripheral portion of the semiconductor device and the gold-plate electrode arranged at both far ends (peripheral portion) of the heat-generating region has the narrowest width.

In this structure, the width of the ohmic plate electrodes 2, 3 is similar to that of a conventional one at the respective portions of the heat generating region. Thus, there is no effect on the electric characteristics such as withstanding pressure.

Next, a method of manufacturing the semiconductor device of the first embodiment is described. After the ohmic plate electrodes 2, 3 are formed on a semiconductor substrate 10, for example, to connect with source or drain impurity regions in the semiconductor substrate 10. Then, those ohmic plate electrode 2, 3 are covered with a protective film 506, for example, an insolation film. Then, through holes 201 are formed to expose on the top surface of the ohmic plate electrodes 2, 3. For example, the through holes has a width of 6 μm. After gold-metal is formed by sputtering, gold-plate electrodes 200 are formed by etching the gold-metal using the photoresist as a mask. Upon this method, the width of the gold-plate electrode 200 can be easily varied by the mask design. Further, it is possible to use a protective film 506 that can be eliminated subsequent to forming the gold plate electrode 200, so that highly insulative gases remain (and increased heat reduction can occur).

Figure 3:
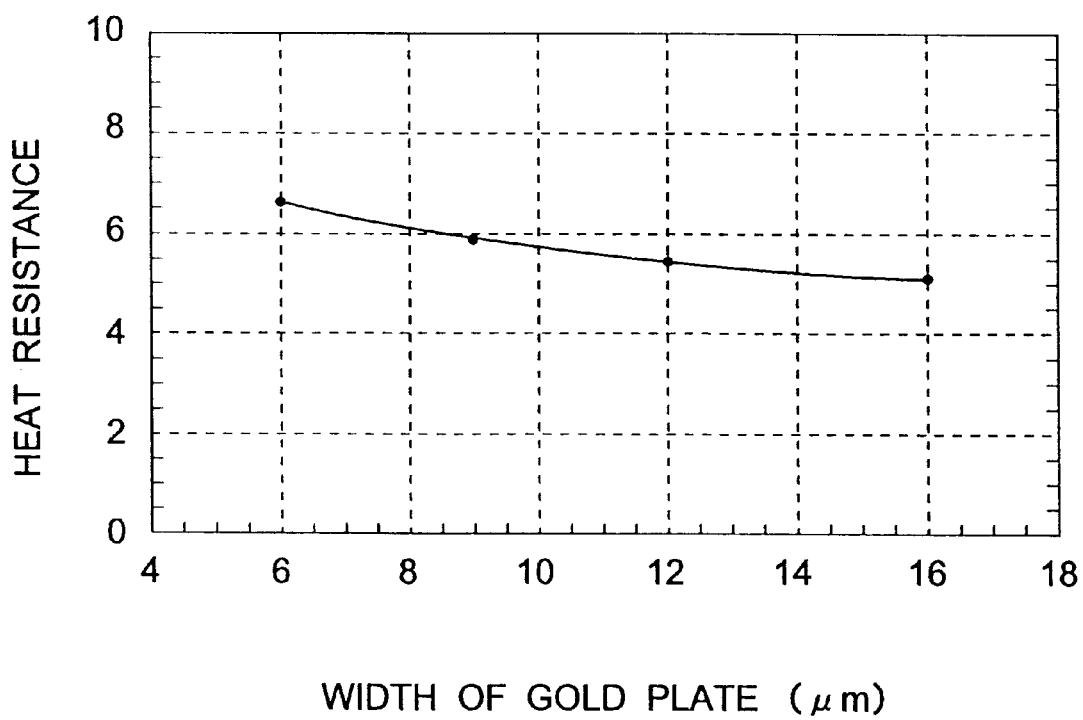
FIG. 3 is a graph which illustrates the dependency of heat resistance on the width of gold-plate electrode of the semiconductor device shown in FIG. 1.

FIG. 3 shows the dependency of heat resistance of one example, a field effect transistor, relative to the width W of the gold-plate electrode 200. The field effect transistor has total 44 gold-plate electrodes 200, each having a length of 270 μm. In order to get the measurement result of FIG. 3, the structure except the width W of the gold-plate electrode 200 is the same as the semiconductor device shown in FIG. 1, and the width of the gold-plate electrode 200 is evenly varied over the entire heat generating region so as to ascertain the dependency of the effect of heat radiation on the width of the gold-plate electrode 200.

As a result, when the width W of the gold-plate electrode 200 is increased from 6 μm to 16 μm, the heat resistance can be decreased from 6.5° C./W to 5° C./W. More specifically, since there arises difference in heat resistance of 1.5° C./W between the cases where the width W of the gold-plate electrode 200 is 6 μm and where it is 16 μm, if the input power is 10 W, for example, there arises temperature difference of 15° C.

Figure 4A:
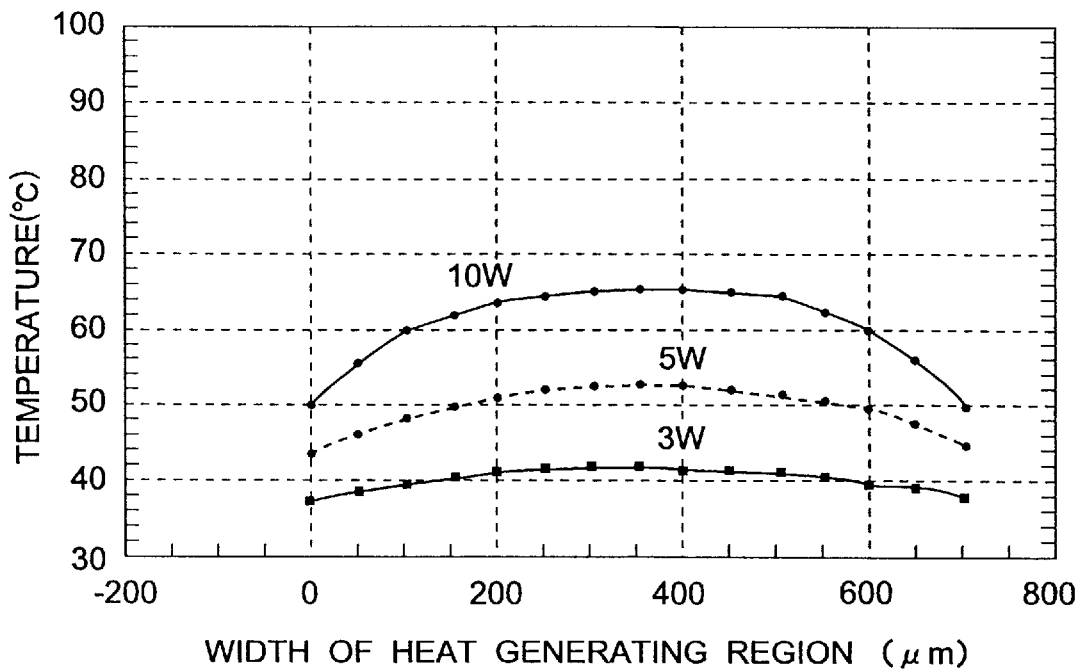
FIGS. 4A and 4B are graphs which illustrate a temperature distribution in a heat generating region of the semiconductor device which has gold-plate electrodes having the same width, in a direction perpendicular to the fingers and in a direction in parallel to the fingers, respectively.
Figure 4B:
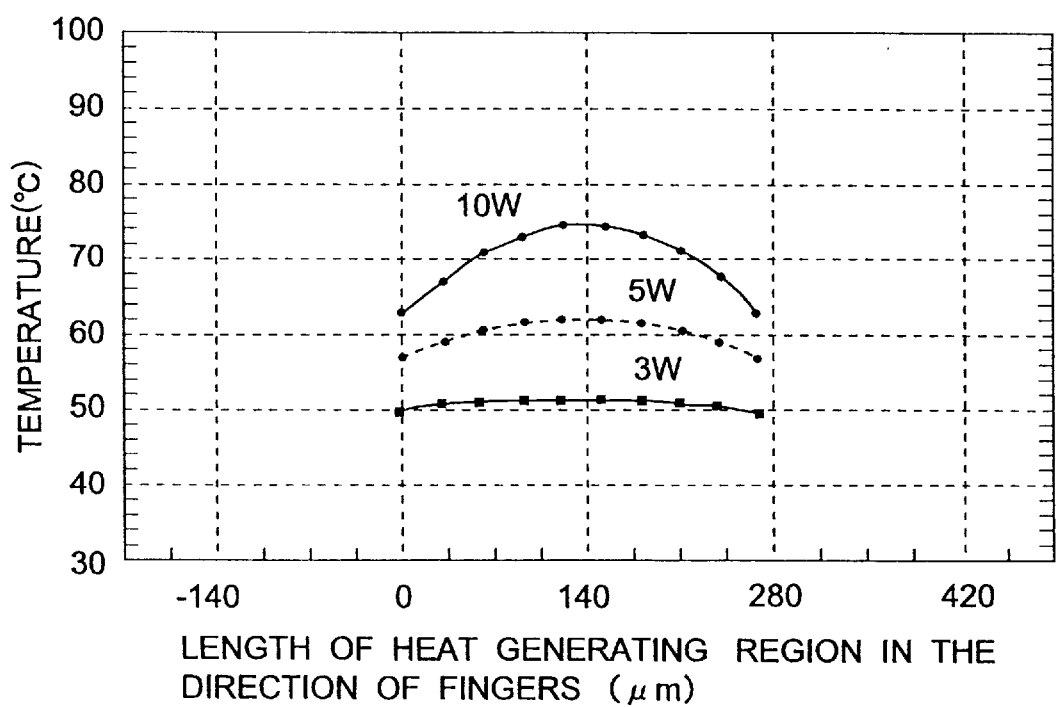

Next, referring FIGS. 4 and 5, a method of setting the width W of the gold-plate electrodes 200 is explained as follows. At first, data is prepared by measuring a semiconductor device which has a plurality of the gold-plate electrodes 200, each plate electrodes 200 having the same width as shown in FIGS. 4A and 4B. FIG. 4A shows a temperature distribution on a plane perpendicular to drain, source, and gate plate electrodes 1, 2 and 3 (in a direction perpendicular to the longitudinal direction of the fingers). FIG. 4B shows a temperature distribution on a plane in parallel to the plate electrodes 1, 2 and 3 (in a direction parallel to the longitudinal direction of the fingers). The length of the plate electrode 1, 2, or 3 is 270 μm, the number of the source and drain plate electrodes 2 and 3 is 44, and the width W of a gold-plate electrode 200 is 6 μm.

As a result, the temperature of the center portion in the heat generating region is higher than that of a peripheral portion. Since the temperature difference between a peripheral portion and the center portion becomes larger as the input power increases, the center portion of the heat generating region reaches the critical temperature and heat deterioration begins although the average temperature of the heat generating region does not reached the critical temperature of heat deterioration.

Figure 5:
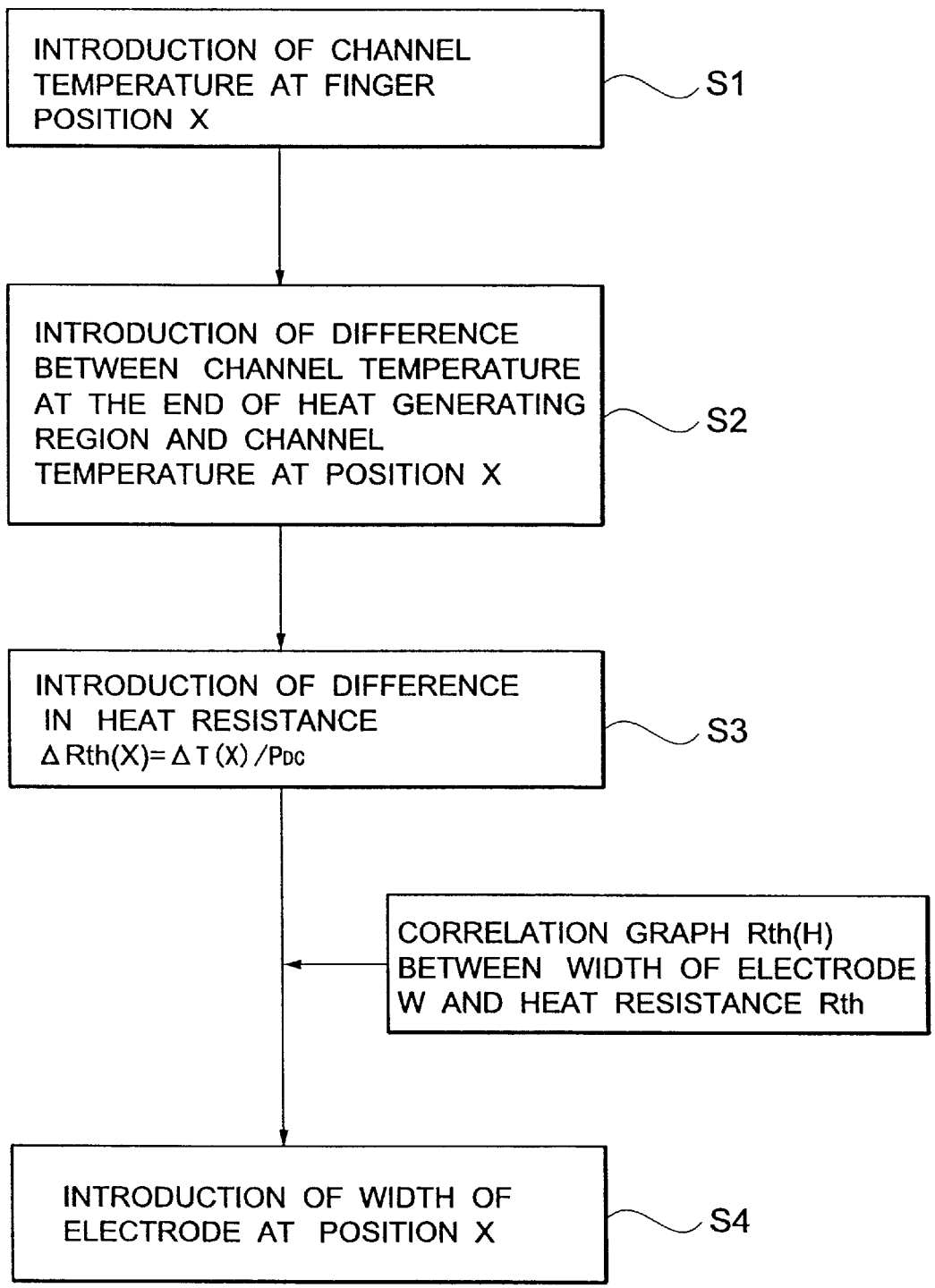
FIG. 5 shows a chart for explaining the procedure of setting the width of plate electrodes of the semiconductor device shown in FIG. 1.

Next, as shown in FIG. 5, with regard to setting of the width of each of gold-plate electrodes 200 in a direction perpendicular to the fingers, from FIG. 4A, the difference ΔT(x) between the temperature of channel region under a finger at an arbitrary position x in the heat generating region and the temperature of channel temperature under a finger at an end of the heat generating region is calculated (Steps S1 and S2).

By dividing the temperature difference ΔT(x) by the input power $P_{dc}$, the difference in heat resistance to be adjusted with regard to each finger $\Delta R_{th}(x) = \Delta T(x)/P_{dc}$ is introduced (Step S3).

From the relationship (correlation graph) $R_{th}(H)$ between the heat resistance $R_{th}$ and the width W of the gold-plate electrode shown in FIG. 3, the width of the gold-plate electrode is set with regard to each finger based on the width of the gold-plate electrode of the finger at the end of the heat generating region (Step S4).

With regard to the temperature distribution in parallel to the fingers, adjustment can also be made from FIG. 4B using this method.

For example, in FIG. 4A, in the temperature distribution in case 10 W is input, a temperature difference of about 15° C. arises between an end of the heat generating region and the center portion. Accordingly, from FIG. 3, in case the width W of the gold-plate electrode 200 at an end of the heat generating region is 6 μm, by setting that at the center portion 16 μm, the temperature difference of 15° C. can be adjusted. With regard to the temperature distribution in parallel to the fingers, adjustment can also be made similarly.

Figure 6A:
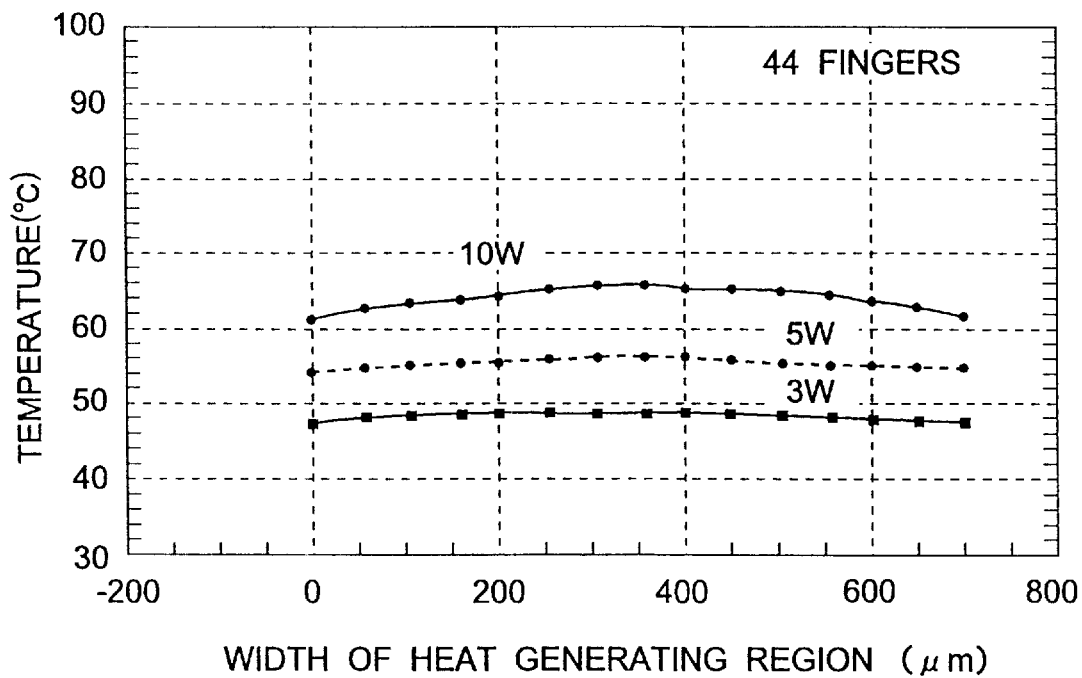
FIGS. 6A and 6B are graphs which illustrate a temperature distribution in a heat generating region of the semiconductor device shown in FIG. 1, in a direction perpendicular to the fingers and in a direction parallel to the fingers, respectively.
Figure 6B:
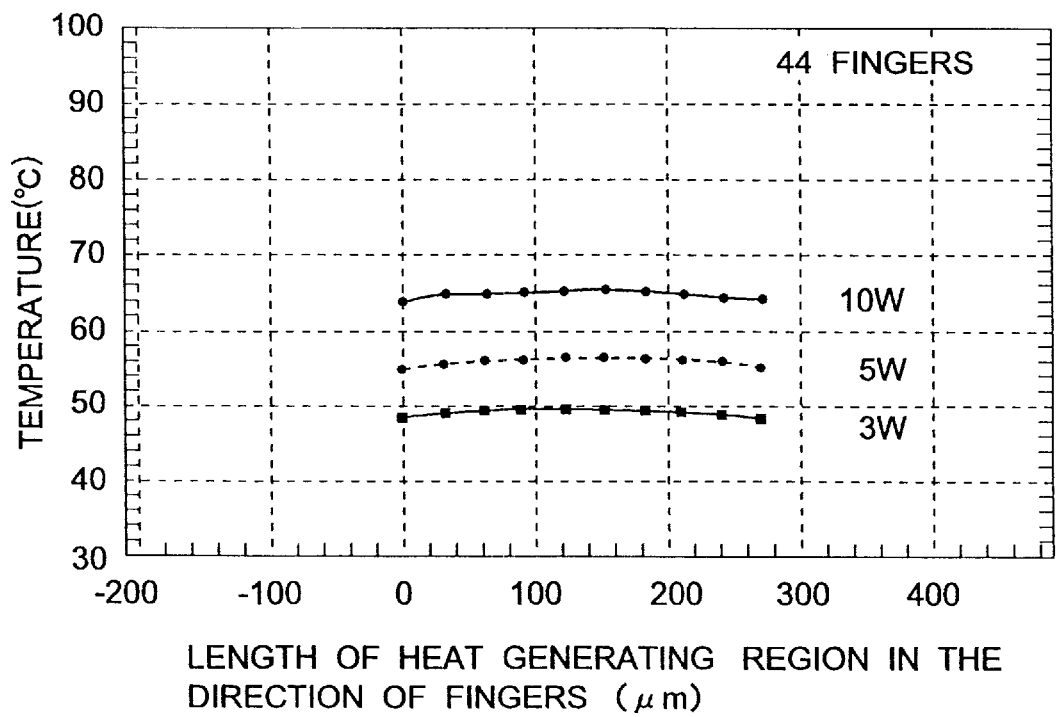

FIGS. 6A and 6B show an example of a temperature distribution in the heat generating region for the example where the width of the gold-plate electrode is set as discussed above. With reference to FIGS. 6A and 6B, even in case 10 W is input, the temperature distribution in the heat generating region is made substantially even.

Figure 7:
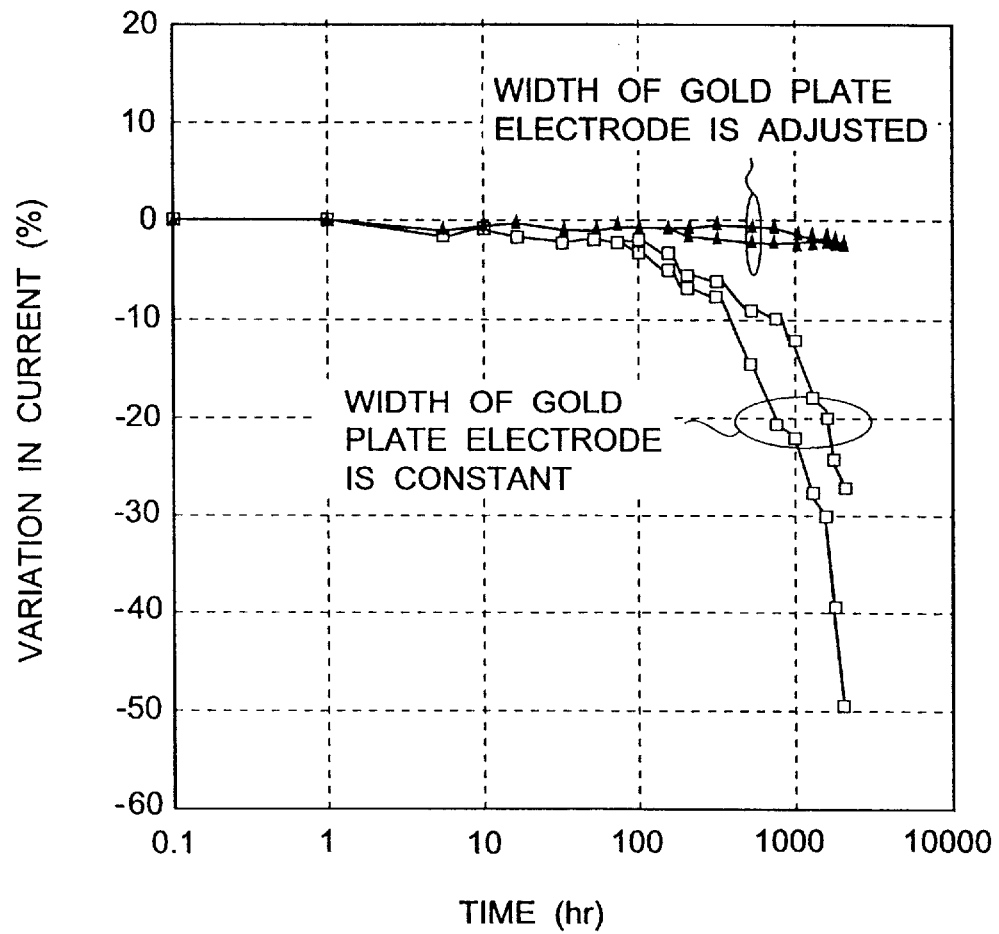
FIG. 7 is a graph which illustrates the result of a high temperature energizing test of the semiconductor device shown in FIG. 1.

FIG. 7 shows the result of a high power dissipation test of a field effect transistor of the present invention compared with the result of a high power dissipation test of a field effect transistor where the width of the gold-plate electrode is constant. The vertical axis shows variation in current and the horizontal axis shows time. As illustrated in FIG. 7, although the input power is the same, the degradation in current for the sample of the present invention is less (e.g., where the width of the gold-plate is varied) than that of the sample where the temperature is uneven (i.e., where the width of the gold-plate electrode is constant).

Figure 8A:
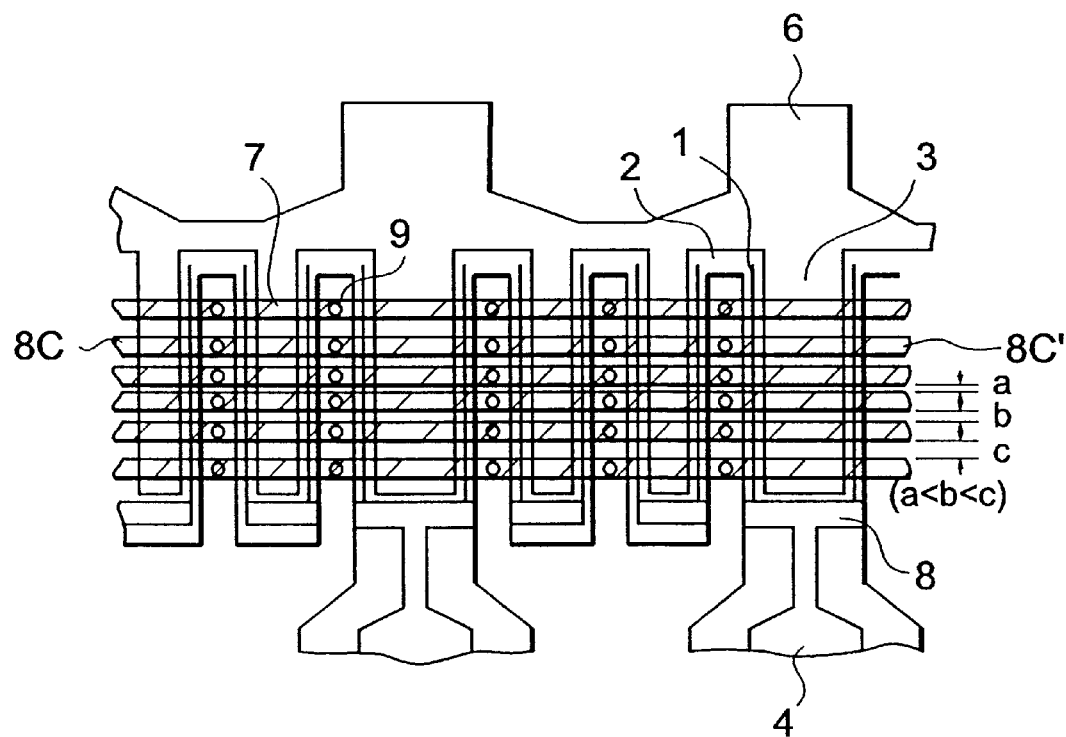
FIGS. 8A and 8B illustrate a semiconductor device of a second embodiment of the present invention.
Figure 8B:
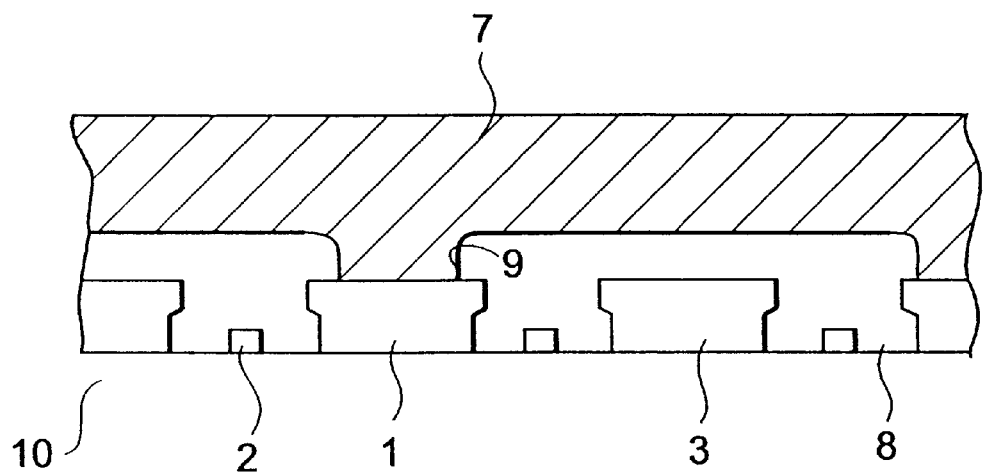

FIGS. 8A and 8B shows a semiconductor device (a field effect transistor) of a second embodiment of the present invention. In the present example, a plurality of stripe plate electrodes 7 for heat radiation are formed in parallel in a direction perpendicular to source, gate, and drain plate electrode 2, 1 and 3. The stripe plate electrodes 7 are electrically connected with either the source plate electrode (fingers) 2 or the drain plate electrode (fingers) 3.

The intervals a, b, c, etc, between the stripe plate electrodes 7 arranged in parallel are formed so as to be narrowest at the center portion in the heat generating portion and be wider from the center portion toward a peripheral portion (an end portion of the fingers). The stripe plate electrodes 7 are formed using, for example, an Au plating process. In order to enhance the heat radiation, the thickness is as large as on the order of 5–10 μm.

A manufacturing process of the second embodiment is now described specifically in the following. First, the source, gate, and drain plate electrodes 1, 2 and 3 are formed on the semiconductor substrate. Then, as an interlayer film 8, $SiO_2$, for example, is formed at a thickness of 1–2 μm on those plate electrodes. Using photoresist and dry etching processes, through holes 9 are provided to expose the top surface of the source or drain plate electrode 2 or 3. Next, a photoresist is provided on the insulator film 8 and etched to form string openings which intersects the plate electrodes 1, 2 and 3. Then, by a conventional gold-plate electrode process, a gold-plate electrode layer at a thickness of 5–10 μm is formed so as to form the stripe plate electrodes 7.

By providing the stripe plate electrodes 7, heat generated from the heat generating region is dissipated from the source plate electrodes 2 through the stripe plate electrodes for heat radiation 7 into the air. Thus, a rise of temperature in the heat generating region can be suppressed.

Further, by making the interval of the stripe plate electrodes 7 more dense at the center portion of the heat generating region (center of the gate plate electrodes 1 length) and more sparse toward a periphery of the heat generating region (ends of the gate plate electrodes 1 length), the heat radiation of the center portion of the plate electrodes is improved, and the temperature distribution in the direction of the plate electrodes can be made substantially even so as to reduce or eliminate localized hot spots.

The intervals of the stripe plate electrodes 7 are set in the following manner. Similarly to the case of the first embodiment, based on FIG. 4A, the difference between the temperature with regard to each source and drain plate electrodes (fingers) and the temperature of each source and drain plate electrodes (fingers) at an end of the heat generating region is calculated. By dividing the temperature difference by the input power, the difference in heat resistance to be adjusted with regard to each finger is introduced.

Figure 9:
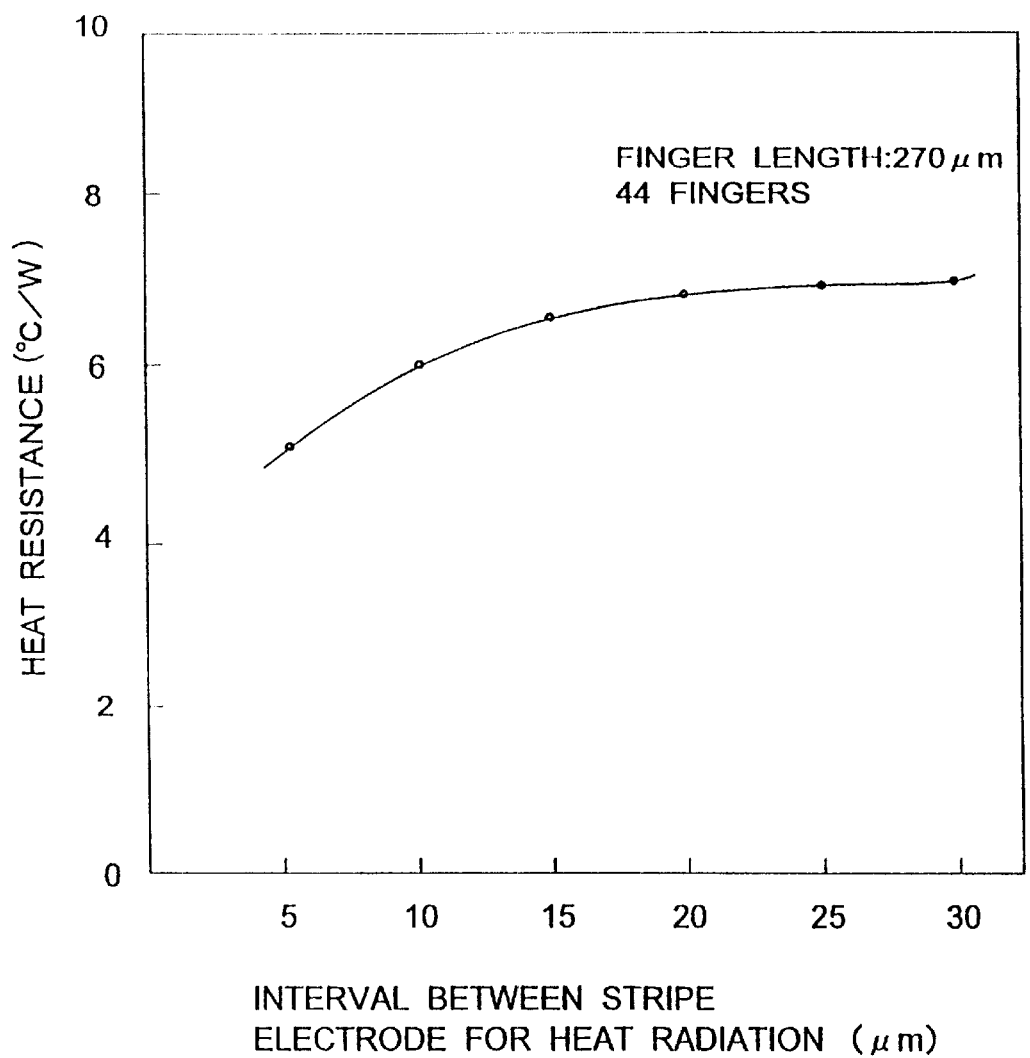
FIG. 9 is a graph which illustrates the dependency of heat resistance on the interval between stripe plate electrodes for heat radiation of the semiconductor device shown in FIGS. 8.

As shown in FIG. 9, by the relationship between the heat resistance and the interval of the stripe plate electrodes 7 found using a field effect transistor with the finger length being 270 μm and with the number of the fingers being 44, the intervals of the stripe plate electrodes 7 are set such that the heat resistance makes even the temperature distribution in the heat generating region (channel temperature of the transistor) in the direction of the gate plate electrodes. FIG. 9 is a graph showing the relationship between the heat resistance (the vertical axis) and the interval between the stripe plate electrodes for heat radiation (the horizontal axis).

Figure 10A:
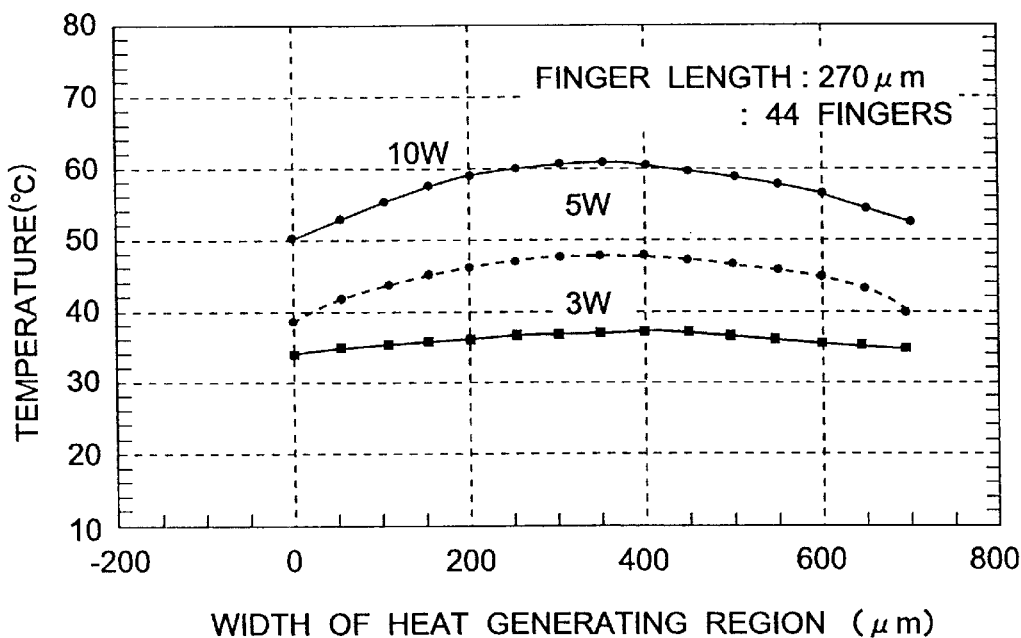
FIGS. 10A and 10B show a graph illustrating a temperature distribution in a heat generating region of the semiconductor device shown in FIGS. 8A and 8B, in a direction perpendicular to the fingers and in a direction in parallel to the fingers, respectively.
Figure 10B:
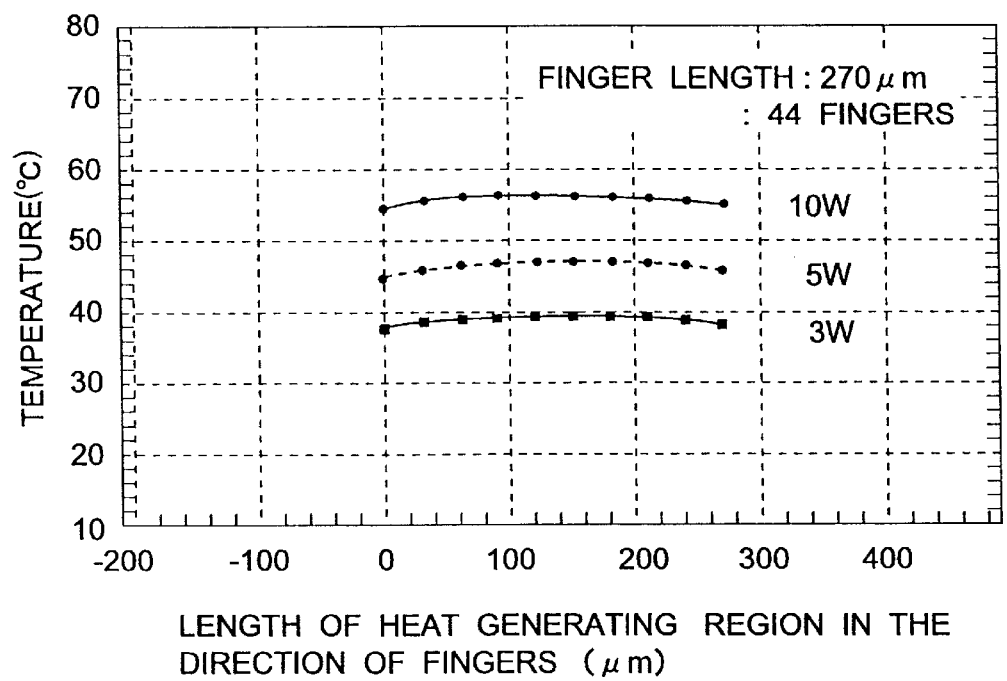

FIGS. 10A and 10B graphs illustrate a temperature distribution in a heat generating region of the semiconductor device shown in FIGS. 8A and 8B, in a direction perpendicular to the fingers and in a direction in parallel to the fingers, respectively. FIG. 10A shows temperature distribution in a direction perpendicular to the fingers for the case where the intervals between the stripe plate electrodes 7 are varied and FIG. 10B shows temperature distribution in a direction in parallel to the fingers for the case where the intervals between the stripe plate electrodes 7 are varied. As shown in these drawings, the temperature in the heat generating region can also be made even by adjusting the intervals, a, b, c, etc, between adjacent stripe plate electrode 7 so that the reliability of the element can be improved, as described in FIG. 7.

Figure 11A:
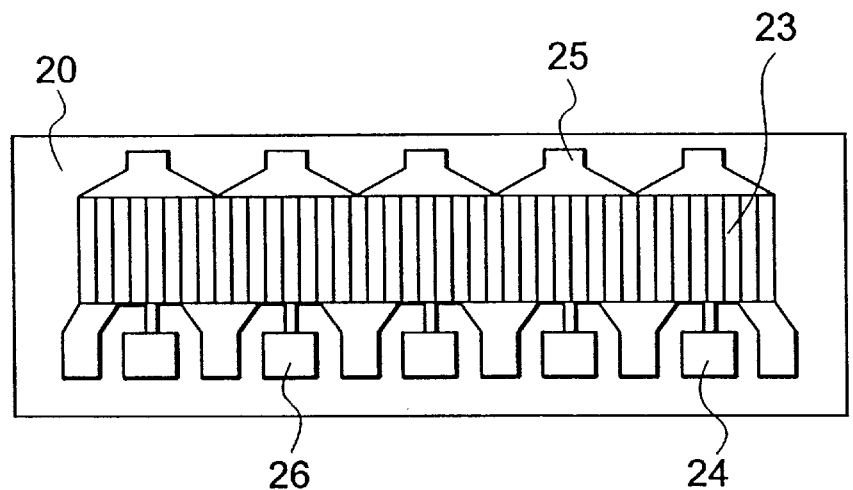
FIG. 11A through 11C illustrate a semiconductor device of a third embodiment of the present invention.
Figure 11B:
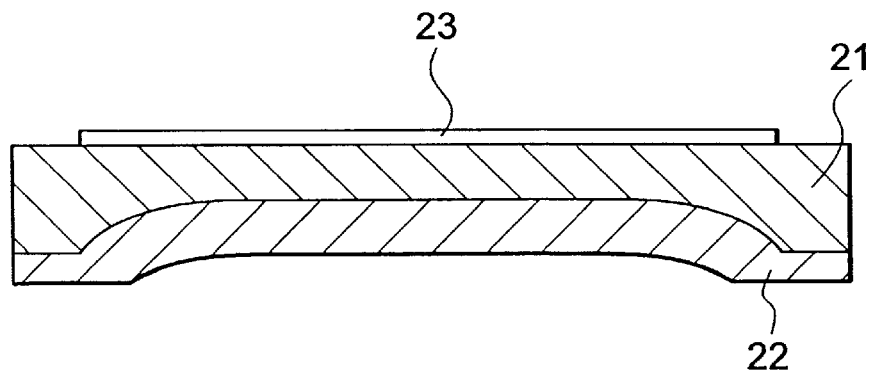
Figure 11C:
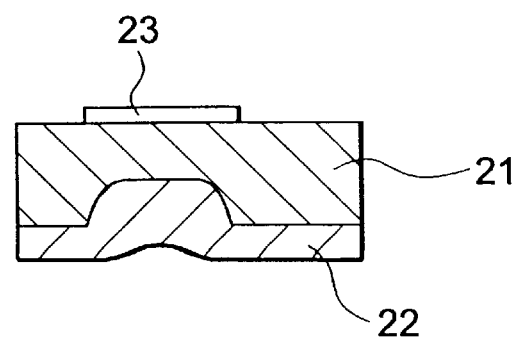

FIGS. 11A to 11C show a semiconductor device(a field effect transistor chip) of a third embodiment of the present invention. Referring to FIGS. 11A to 11C, a field effect transistor is formed on the surface of a semiconductor substrate 21. The transistor includes gate pads 24, drain pads 25 and source pads 26. Further, in the heat generating region, source plate electrodes (fingers), drain plate electrodes (fingers) and gate plate electrodes are formed (not shown). The semiconductor substrate 21 is formed so as to be thin at the center portion of the heat generating region 23 and to be thicker toward a peripheral portion of the heat generating region 23. Here, the thickness of the substrate 21 is determined in a manner as follows.

Figure 12:
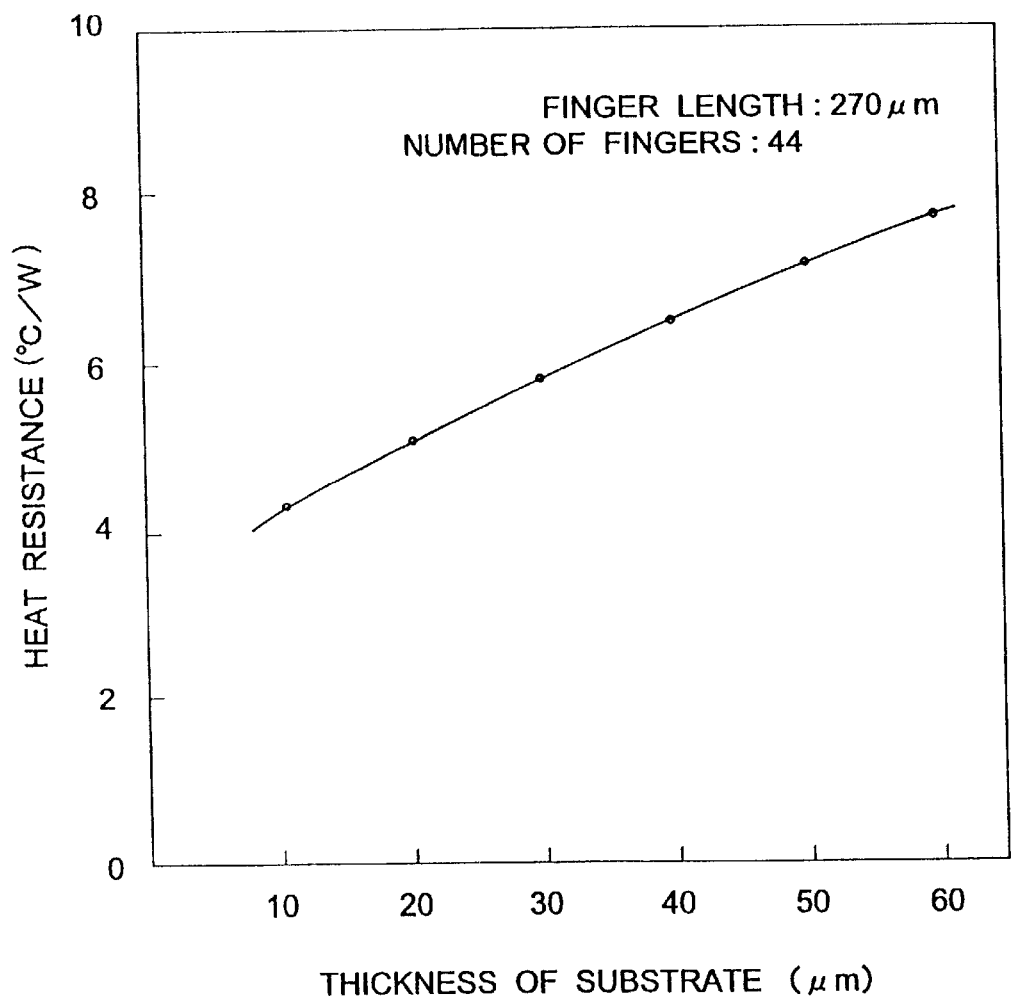
FIG. 12 is a graph which illustrates the dependency of heat resistance on the thickness of the substrate of the semiconductor device shown in FIG. 11A to 11C.

First, from FIG. 4A, the difference between the temperature with regard to each fingers and the temperature at an end of the heat generating region 23 is calculated. By dividing the temperature difference by the input power, the difference in heat resistance to be adjusted in a direction perpendicular to the source and drain plate electrodes (fingers) in the heat generating region 23 is introduced. Next, using the relationship between the heat resistance and the thickness of the semiconductor substrate shown in FIG. 12, the thickness of the substrate 21 with regard to the respective portions of the heat generating region 23 is set such that the heat resistance makes even the temperature distribution (for example, channel temperature of the transistor) in the direction of the gate plate electrodes and the temperature in the direction perpendicular to the gate plate electrodes. Since the relationship between the heat resistance and the thickness of the substrate in FIG. 12 is substantially proportional, the thickness of the substrate 21 is set in the shape substantially similar to curves of the temperature distribution shown in FIG. 4A.

Next, a manufacturing method of the semiconductor device of the third embodiment is described. After the field effect transistor is formed on the surface of the semiconductor substrate 21, the rear surface of the semiconductor substrate 21 is polished such that the semiconductor substrate 21 is thinned to on the order of 100 µm. Next, photoresist is formed so as to open the surface opposing to the heat generating region 23. In case of a GaAs substrate, etchant of phosphoric acid or hydrogen peroxide solution system, for example, is used to further etch the region to on the order of 30 µm, isotopically. Here, by weakening the adherence between the photoresist and the substrate, the taper angle of peripheral portions of the region can be made smaller, and thus, a desired shape can be obtained.

Further, by varying the thickness of the peripheral portions of the heat generating region step by step through a plurality of photoresist processes and etching processes, the thickness of the substrate can be controlled more precisely.

Figure 13A:
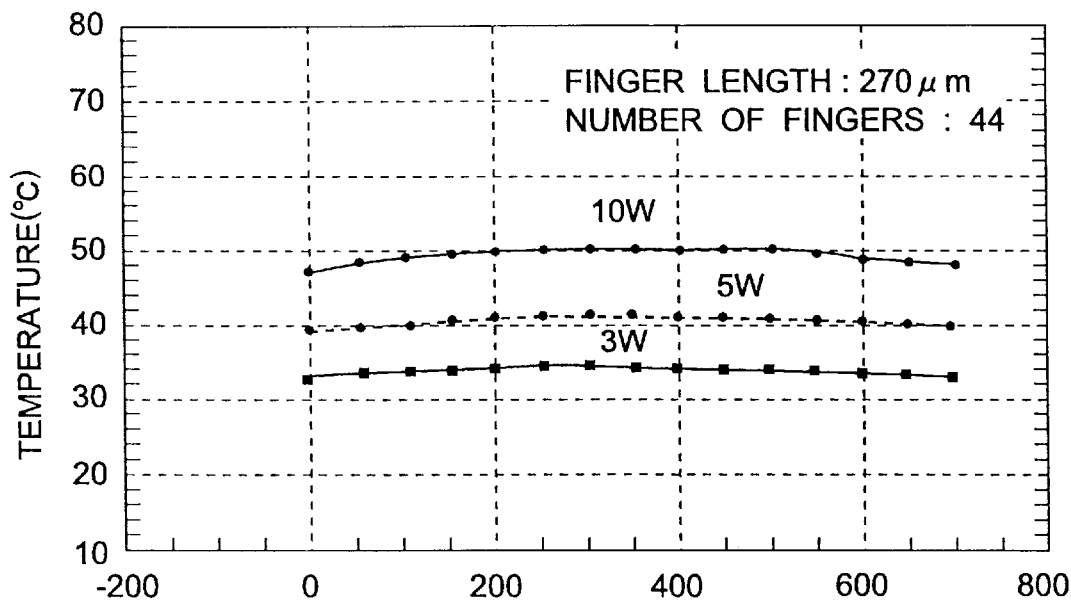
FIGS. 13A and 13B are graphs which illustrate a temperature distribution in a heat generating region of the semiconductor device shown in FIG. 11A to 11C, in a direction perpendicular to the fingers and in a direction in parallel to the fingers, respectively.
Figure 13B:
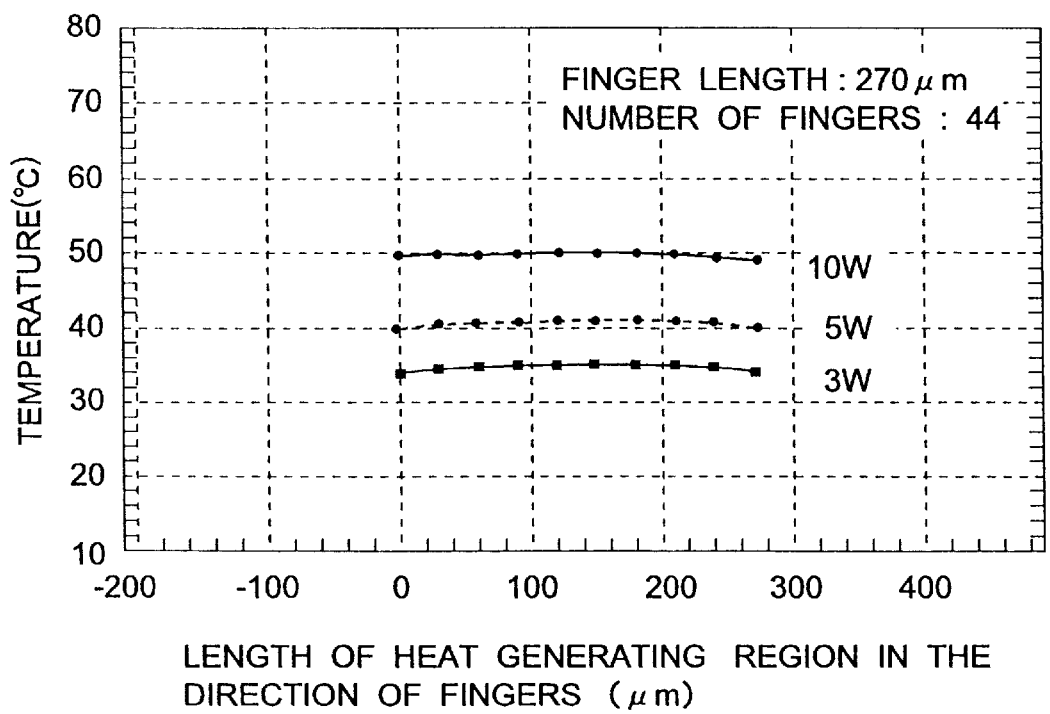

FIG. 13 shows channel temperature distributions of the third embodiment of present invention. As is clear from FIG. 13, the channel temperature can be made substantially even in the heat generating region.

As described in the above, according to the present invention, there is an effect that degradation in the characteristics of a semiconductor transistor due to heat can be suppressed. This can be done by, in the present invention, reducing local heat deterioration at the center portion of a heat generating region by making substantially even the temperature distribution in the heat generating region so that localized hot spots are reduced or eliminated.

It is apparent from the specification that the present invention is not limited to the above-described embodiments but may be modified and changed without departing from the scope and spirit of the invention. For example, any conductive material for the plate electrode may be used in place of gold plate electrode as long as the conductive plate electrode has high radiation or conductivity of heat. Also, the first, second, and third embodiments can be combined in any combination to obtain a device substantially free from localized hot spots that could deteriorate a power devices electrical performance.

What is claimed is:

1. A semiconductor device, comprising:
   a semiconductor substrate having a heat generating region;
   first, second, and third electrodes formed on said semiconductor substrate:
   a plurality of first conductive fingers arranged in parallel with each other in said heat generating region, each of said first conductive fingers coupled to one of said first electrodes electrically;
   a plurality of second conductive fingers arranged in parallel with said first conductive fingers in said heat generating region, each of said second conductive fingers coupled to one of said second electrodes electrically, each of said second conductive fingers arranged between the respective ones of said first conductive fingers;
   a plurality of third conductive fingers arranged in parallel with said first conductive fingers in said heat generating region, each of said third conductive fingers coupled to one of said third electrodes electrically, each of said third conductive fingers arranged between one of the respective first conductive fingers and one of the respective second conductive fingers; and
   a heat radiator that makes temperature distribution in said heat generating region substantially uniform, wherein said heat radiator includes a plurality of metal plate electrodes formed on at least one of said first and second conductive fingers, each of said metal plate electrodes being in parallel with said first conductive fingers, and a first metal electrode of said plurality of metal plate electrodes arranged at a center portion of said heat generating region has a width which is wider than that of a second metal electrode of said plurality of metal plate electrodes arranged at a peripheral portion of said heat generating region.

2. The device as claimed in claim 1, wherein said first metal electrode has a width which is widest at a center thereof and narrows from said center to both ends thereof.

3. A semiconductor device, comprising:
   a semiconductor substrate having a heat generating region;
   first, second, and third electrodes formed on said semiconductor substrate;
   a plurality of first conductive fingers arranged in parallel with each other in said heat generating region, each of said first conductive fingers coupled to one of said first electrodes electrically;
   a plurality of second conductive fingers arranged in parallel with said first conductive fingers in said heat generating regions, each of said second conductive fingers coupled to one of said second electrodes electrically, each of said second conductive fingers arranged between the respective ones of said first conductive fingers;

a plurality of third conductive fingers arranged in parallel with said first conductive fingers in said heat generating regions, each of said third conductive fingers coupled to one of said third electrodes electrically, each of said third conductive fingers arranged between one of the respective first conductive fingers and one of the respective second conductive fingers; and a heat radiator that makes temperature distribution in said heat generating region substantially uniform, wherein said heat radiator includes a plurality of stripe plate electrodes in parallel with each other over said heat generating region and arranged perpendicular to said first conductive fingers, is electrically coupled with one of said first and second conductive fingers, and the density of said stripe plate electrodes is more dense around at a center of said heat generating region and is more sparse at a peripheral portion of said heat generating region.

4. The device as claimed in claim 3, wherein said plurality of stripe plate electrodes have the same width.

5. A semiconductor device, comprising:

a semiconductor substrate having a heat generating region;

first second, and third electrodes formed on said semiconductor substrate;

a plurality of first conductive fingers arranged in parallel with each other in said heat generating region, each of said first conductive fingers coupled to one of said first electrodes electrically;

a plurality of second conductive fingers arranged in parallel with said first conductive fingers in said heat generating region, each of said second conductive fingers coupled to one of said second electrodes electrically, each of said second conductive fingers arranged between the respective ones of said first conductive fingers;

a plurality of third conductive fingers arranged in parallel with said first conductive fingers in said heat generating region, each of said third conductive fingers coupled to one of said third electrodes electrically, each of said third conductive fingers arranged between one of the respective first conductive fingers and one of the respective second conductive fingers; and a heat radiator that makes temperature distribution in said heat generating region substantially uniform, wherein said heat radiator is a thickness of said semiconductor substrate, and said thickness is gradually increased from a center portion of said heat generating region toward a peripheral portion of said heat generating region.

6. The device as claimed in claim 5, wherein said heat generating region is an area covered by a power device.

7. The device as claimed in claim 6, wherein said power device is a power transistor.

8. The device as claimed in claim 7, wherein said first electrode is a source electrode, said second electrode is a drain electrode, and said third electrode is a gate electrode.

9. The device as claimed in claim 8, wherein said heat radiator includes a plurality of gold plate electrodes formed on at least one of said first and second conductive fingers.

10. The device as claimed in claim 9, wherein a first one of said plurality of metal plate electrodes arranged at a center portion of said heat generating region has a width which is wider than that of a second one arranged at a peripheral portion of said heat generating region.

11. A power transistor comprising:

a semiconductor substrate having a heat generating region;

source, drain, and gate electrodes formed on said semiconductor substrate;

a plurality of source fingers arranged in parallel with each other in said heat generating region, each of said source fingers electrically connected to said source electrode;

a plurality of drain fingers arranged in parallel with said source fingers in said heat generating region, each of said drain fingers electrically connected to said drain electrode, and arranged between the respective said source fingers;

a plurality of gate fingers arranged in parallel with said source fingers in said heat generating region, each of said gate fingers electrically connected to said gate electrode, and arranged between the respective source finger and the respective drain finger; and a plurality of gold plate electrodes formed on at least one of said source and drain fingers, said each of said gold plate electrodes being in parallel with said source fingers, a first one of said plurality of gold plate electrodes arranged at a center portion of said heat generating region has a width which is wider than that of a second one of said plurality of gold plate electrodes arranged at a peripheral portion of said heat generating region.

12. The power transistor as claimed in claim 11, further comprising a plurality of gold stripe plate electrodes in parallel with each other over said heat generating region and arranged perpendicular to said source finger, electrically connected with one of said source and drain fingers and the density of said gold stripe plate electrodes is more dense around at a center of said heat generating region and is more sparse at a peripheral of said heat generating region.

13. The power transistor as claimed in claim 12, wherein a thickness of said semiconductor substrate is gradually increased from a center portion of said heat generating region toward a peripheral portion of said heat generating region.

14. A power transistor comprising:

a semiconductor substrate having a heat generating region;

source, drain, and gate electrodes formed on said semiconductor substrate;

a plurality of source fingers arranged in parallel with each other in said heat generating region, each of said source fingers electrically connected to said source electrode;

a plurality of drain fingers arranged in parallel with said source fingers in said heat generating region, each of said drain fingers electrically connected to said drain electrode, and arranged between the respective said source fingers;

a plurality of gate fingers arranged in parallel with said source fingers in said heat generating region, each of said gate fingers electrically connected to said gate electrode and arranged between the respective source finger and the respective drain finger; and a plurality of gold stripe plate electrodes in parallel with each other over said heat generating region and arranged perpendicular to said source finger, electrically connected with one of said source and drain fingers and the density of said gold stripe plate electrodes is more dense around at a center of said heat generating region and is more sparse at a peripheral of said heat generating region.

15. A power transistor comprising:

a semiconductor substrate having a heat generating region;

source, drain, and gate electrodes formed on said semiconductor substrate;

a plurality of source fingers arranged in parallel with each other in said heat generating region, each of said source fingers electrically connected to said source electrode;

a plurality of drain fingers arranged in parallel with said source fingers in said heat generating region, each of said drain fingers electrically connected to said drain electrode, and arranged between the respective said source fingers; and a plurality of gate fingers arranged in parallel with said source fingers in said heat generating region, each of said gate fingers electrically connected to said gate electrode, and arranged between the respective source finger and the respective drain finger;

wherein a thickness of said semiconductor substrate is gradually increased from a center portion of said heat generating region toward a peripheral portion of said heat generating region.

* * * * *